(12) United States Patent
Liu

(10) Patent No.: US 11,984,505 B2
(45) Date of Patent: May 14, 2024

(54) MOSFET DEVICES AND MANUFACTURING METHODS THEREOF

(71) Applicant: CHANGXIN MEMORY TECHNOLOGIES, INC., Anhui (CN)

(72) Inventor: ChihCheng Liu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 390 days.

(21) Appl. No.: 17/310,762

(22) PCT Filed: Mar. 8, 2021

(86) PCT No.: PCT/CN2021/079595
§ 371 (c)(1),
(2) Date: Aug. 20, 2021

(87) PCT Pub. No.: WO2021/203888
PCT Pub. Date: Oct. 14, 2021

(65) Prior Publication Data
US 2022/0320334 A1    Oct. 6, 2022

(30) Foreign Application Priority Data
Apr. 7, 2020   (CN) .......................... 202010264968.0

(51) Int. Cl.
*H01L 29/78*   (2006.01)
*H01L 21/265*  (2006.01)
(Continued)

(52) U.S. Cl.
CPC .... *H01L 29/7827* (2013.01); *H01L 21/26586* (2013.01); *H01L 29/0607* (2013.01); *H01L 29/1045* (2013.01); *H01L 29/4236* (2013.01)

(58) Field of Classification Search
CPC ........... H01L 29/7827; H01L 21/26586; H01L 29/0607; H01L 29/1045; H01L 29/4236;
(Continued)

(56) References Cited

U.S. PATENT DOCUMENTS

| 7,687,852 | B2  | 3/2010 | Rough et al. |
| 2006/0163631 | A1* | 7/2006 | Chen ................ H10B 12/0383 257/296 |

(Continued)

FOREIGN PATENT DOCUMENTS

| CN | 107958907 A | 4/2018 |
| CN | 208923143 U | 5/2019 |
| CN | 111063722 A | 4/2020 |

OTHER PUBLICATIONS

International Search Report in Application No. PCT/CN2021/079595 mailed on Jun. 9, 2021.

*Primary Examiner* — Shahed Ahmed
(74) *Attorney, Agent, or Firm* — Syncoda LLC; Feng Ma

(57) ABSTRACT

A semiconductor device includes a substrate, a gate oxide layer, a gate electrode and an injection region. The substrate includes a trench, a source region, a drain region and a channel region. The trench includes trench sidewalls and a trench bottom wall. The gate oxide layer is disposed in the trench. The gate oxide layer includes a groove. The gate electrode is disposed in the groove. The injection region is located on at least a side of the trench bottom wall, and at least a part of the injection region is closer to the drain region than the source region so that a threshold voltage at a portion of the channel region close to the injection region is less than a threshold voltage at a portion of the channel region far from the injection region.

12 Claims, 3 Drawing Sheets

(51) Int. Cl.
*H01L 29/06* (2006.01)
*H01L 29/10* (2006.01)
*H01L 29/423* (2006.01)

(58) Field of Classification Search
CPC .......... H01L 21/28105; H01L 29/4983; H01L 29/512; H01L 29/66659; H01L 29/78; H01L 29/7813; H01L 29/7825; H01L 29/66613–66628; H01L 29/42336; H01L 29/42352; H01L 21/046–047; H01L 21/265–266; H10B 12/053; H10B 12/34
See application file for complete search history.

(56) References Cited

U.S. PATENT DOCUMENTS

| | | |
|---|---|---|
| 2009/0291541 A1 | 11/2009 | Jang et al. |
| 2017/0186844 A1* | 6/2017 | Kim ..................... H10B 12/053 |
| 2020/0203482 A1* | 6/2020 | Kaji ....................... H01L 29/78 |

* cited by examiner

MOSFET DEVICES AND MANUFACTURING METHODS THEREOF

CROSS-REFERENCE TO RELATED APPLICATIONS

This application is a national stage of International Application No. PCT/CN2021/079595 filed on Mar. 8, 2021, which claims priority to Chinese Patent Application No. 202010264968.0, filed on Apr. 7, 2020. The disclosures of these applications are hereby incorporated by reference in their entirety.

TECHNICAL FIELD

The present disclosure relates to the technical field of semiconductors, and in particular to a semiconductor device and a manufacturing method thereof.

BACKGROUND

With the development of electronic technology, electronic devices have become smaller and shown higher processing capacity, which proposes higher requirements on storage devices and memories. The highly integrated element design can achieve the effect of both the miniaturization of elements and the increased storage capacity.

Dynamic random-access memory (DRAM) may fail due to "row hammering". Row hammering can cause charge migration at the pass-gate (PG). In an operating environment where a single row is continuously accessed, the parasitic electrons induced through the gate terminal may easily leak to the bit line contact terminal, causing the data in adjacent non-accessed rows to collapse. For highly integrated elements, the reduced word line spacing will make the "row hammering" more serious, especially at the bottom of the gate terminal.

SUMMARY

A main purpose of the present disclosure is to provide a semiconductor device and a manufacturing method thereof, to overcome at least one of the above-mentioned drawbacks of the prior art.

According to a first aspect of the present disclosure, a semiconductor device is provided, comprising:
  a substrate, the substrate comprising a trench, a source region, a drain region and a channel region, the trench comprising trench sidewalls and a trench bottom wall;
  a gate oxide layer, disposed in the trench, the gate oxide layer comprising a groove;
  a gate electrode disposed in the groove; and
  an injection region located on at least a side of the trench bottom wall, at least a part of the injection region being closer to the drain region than the source region so that a threshold voltage at a portion of the channel region close to the injection region is less than a threshold voltage at a portion of the channel region far from the injection region.

According to a second aspect of the present disclosure, a method for manufacturing a semiconductor device is provided, comprising:
  providing a base;
  forming a trench on the substrate and forming a gate oxide layer in the trench, the trench comprising trench sidewalls and a trench bottom wall;
  forming a gate electrode in a groove of the gate oxide layer;
  forming a source region and a drain region on the substrate; and
  forming an injection region on at least a side of the trench bottom wall, at least a part of the injection region being closer to the drain region than the source region so that a threshold voltage at a portion of the channel region close to the injection region is less than a threshold voltage at a portion of the channel region far from the injection region.

The semiconductor device of the present disclosure is provided with an injection region on an inner side or outer side of the groove, thereby reducing the threshold voltage at a portion of the channel region close to the injection region. Since there is a region with a relatively low threshold voltage in the channel region, it is easier to form a communicated channel in this portion of the channel region, and the charge migration in this portion of the channel region is avoided.

BRIEF DESCRIPTION OF THE DRAWINGS

Various objectives, features, and advantages of the present disclosure will become more apparent when considering the following detailed description of the preferred implementations of the present disclosure with reference to the accompanying drawings. The drawings are merely schematic illustrations of the present disclosure, and are not necessarily drawn to scale. In the drawings, the same reference numerals always represent the same or similar parts. In the drawings.

REFERENCE NUMERALS

Figure 1:
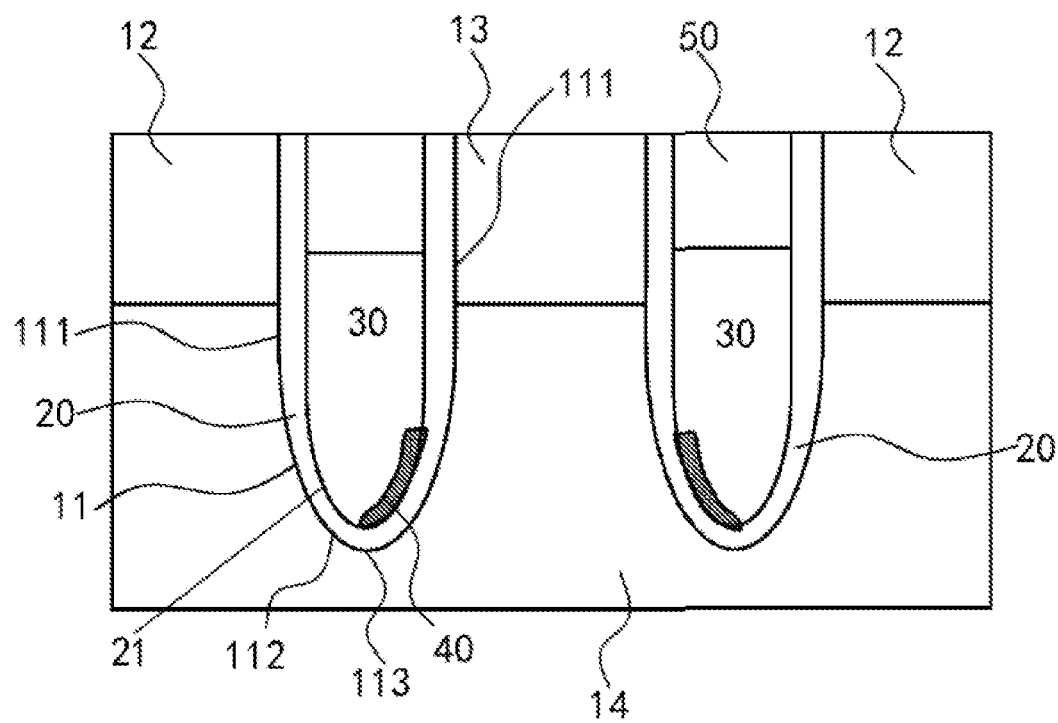
FIG. 1 is a schematic structure diagram of a semiconductor device according to an exemplary implementation.

11: trench; 111: trench sidewall; 112: trench bottom wall; 113: bottom end; 12: source region; 13: drain region; 14: substrate; 20: gate oxide layer; 21: groove; 30: gate electrode; 40: injection region; 50: cover layer; 60: photoresist layer.

DETAILED DESCRIPTION

Typical embodiments embodying the features and advantages of the present disclosure will be described in detail below. It should be understood that the present disclosure may have various changes in different embodiments, without departing from the scope of the present disclosure, and the description and drawings therein are essentially for illustrative purposes, rather than limiting the present disclosure.

In the following description of different exemplary implementations of the present disclosure, reference is made to the accompanying drawings which form a part of the present disclosure and show, by way of example, different exemplary structures, systems, and steps that can implement various aspects of the present disclosure. It should be understood that other specific solutions of components, structures, exemplary devices, systems, and steps may be used, and structural and functional modifications may be made without departing from the scope of the present disclosure. Moreover, although the terms "above", "between", "within", etc., may be used in this specification to describe different exemplary features and elements of the present disclosure, these terms are used herein for convenience only, for example, according to the direction of the examples in the drawings. Nothing in this specification should be understood as requiring a specific three-dimensional direction of the structure to fall within the scope of the present disclosure.

Figure 2:
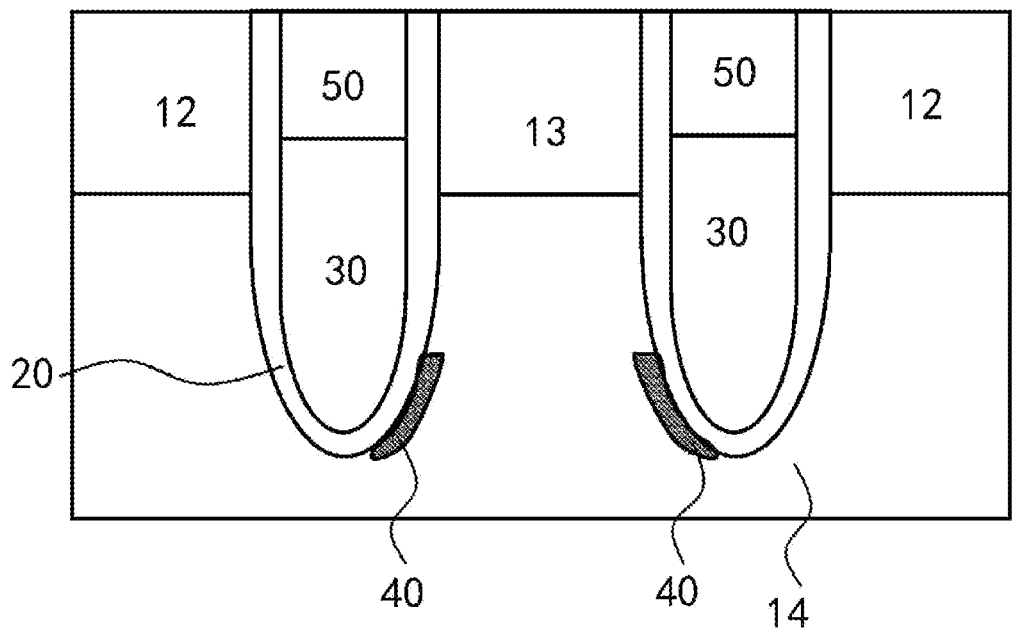
FIG. 2 is a schematic structure diagram of a semiconductor device according to another exemplary implementation.

An embodiment of the present disclosure provides a semiconductor device. Referring to FIGS. 1 and 2, the semiconductor device comprises a substrate 14, the substrate 14 comprising a trench 11, a source region 12, a drain region 13 and a channel region, the trench 11 comprising trench sidewalls 111 and a trench bottom wall 112; a gate oxide layer 20 disposed in the trench 11, the gate oxide layer 20 comprising a groove 21; a gate electrode 30 disposed in the groove 21; and an injection region 40 located on at least a side of the trench bottom wall 112, at least a part of the injection region 40 being closer to the drain region 13 than the source region 12 so that the threshold voltage at a portion of the channel region close to the injection region 40 is less than the threshold voltage at a portion of the channel region far from the injection region 40.

The semiconductor device according to an embodiment of the present disclosure is provided an injection region 40 on an inner side or outer side of the groove 21, thereby reducing the threshold voltage at a portion of the channel region close to the injection region 40. Since there is a region with a relatively low threshold voltage in the channel region, it is easier to form a communicated channel in this portion of the channel region, and the charge migration in this portion of the channel region is avoided. In this way, the problem of the damage to the semiconductor device due to charge migration in the prior art is avoided.

In an embodiment, the charges at the bottom of the channel region are more prone to migration. Therefore, an injection region 40 is provided near the trench bottom wall 112 to reduce the threshold voltage at the bottom of the channel region. In an operating environment where a single row is continuously accessed, the parasitic electrons induced through the gate electrode 30 may easily leak to the bit line contact terminal, i.e., the connection position with the drain region 13, so it is necessary to ensure that at least a part of the injection region 40 is closer to the drain region 13 than the source region 12, so that the threshold voltage at the bottom of the channel region close to the drain region 13 is reduced.

In an embodiment, as shown in FIG. 1, the trench 11 is a U-shaped trench which comprises trench sidewalls 111 and a trench bottom wall 112. The two ends of the trench sidewall 111 are respectively connected to the source region 12 and the drain region 13. That is, half of the trench bottom wall 112 is close to the source region 12, and the other half of the trench bottom wall 112 is close to the drain region 13; and an injection region 40 is provided on an inner side and/or outer side of the half of the trench bottom wall 112 close to the drain region 13. The trench bottom wall 112 is a curved surface, and the trench sidewalls 111 are two planes. The charges at the bottom of the channel region arranged around the trench 11 are more prone to migration, i.e., at the position opposite to the trench sidewalls 111. Threshold voltage at the bottom of the channel region may be changed by providing an injection region 40 on an inner side or outer side of the trench bottom wall 112.

In an embodiment, the threshold voltage at the portion of the channel region close to the injection region 40 is 0.05 V to 0.1 V lower than the threshold voltage at the portion of the channel region far from the injection region 40.

In an embodiment, as shown in FIG. 1, the trench bottom wall 112 has a bottom end 113, the injection region 40 extends along the extension direction of the trench bottom wall 112, and the injection region 40 is located on a side of the bottom end 113 close to the drain region 13. The bottom end 113 is the lowest point of the trench bottom wall 112. The wall surfaces on both sides of the bottom end are respectively close to the source region 12 and the drain region 13, where the injection region 40 is located on the side of a wall surface close to the drain region 13, to reduce the threshold voltage at the side of the bottom of the channel region close to the drain region 13. Wherein, the extension direction of the trench 11 and the extension direction of the groove 21 are approximately the same, that is, they are both extended to form a U-shaped groove. The injection region 40 extends along the extension direction of one of the U-shaped grooves. The extension direction here is mainly means that the trend of extension is the same.

In an embodiment, the length of the channel region between the source region 12 and the drain region 13 is A, and the length of the injection region 40 is B, wherein, A is greater than or equal to 10B and less than or equal to 12B. The length of the channel region is the path along which the source region 12 and the drain region 13 are communicated to each other, that is, the distance from an end connected to the source region 12 to the other end connected to the drain region 13. The length direction of the injection region 40 is consistent with the length direction of the channel region, with a small overall size. Only the threshold voltage at part of the channel region needs to be changed.

As shown in FIG. 1, the gate electrodes 30 are all disposed in the groove 21. The semiconductor device further comprises: a cover layer 50 disposed on the gate electrode 30 and located in the groove 21. The cover layer 50 is filled in the groove 21 to shield the gate electrode 30, and the tops of the source region 12, the drain region 13, the gate oxide layer 20, and the cover layer 50 are in a same plane. The cover layer 50 is a titanium nitride (TiN) layer.

In an embodiment, the substrate 14 is a P-type substrate, and the source region 12 and the drain region 13 are both N-type ion doped regions.

In an embodiment, the substrate 14 is a P-type substrate, the source region 12 and the drain region 13 are two N-type regions formed by N-type ion doping, and the channel region connects the source region 12 with the drain region 13. The P-type substrate is a substrate injected with P-type ions (group-III ions such as boron B or gallium Ga). The source region 12 and the drain region 13 are two lightly doped drains (LDDs) injected with N-type ions (group-V ions such as phosphorus P or arsenic As).

In an embodiment, there are multiple gate electrodes 30 and two adjacent gate electrodes 30 share one drain region 13. The substrate 14 comprises multiple trenches 11, and each trench 11 is provided with a gate oxide layer 20 and a gate electrode 30 and corresponds to an injection region 40. The size of the semiconductor device can be reduced by sharing a same drain region 13 with two adjacent gate electrodes 30, that is, two adjacent gate electrodes 30 is closer to each other. This design will make row hammering more serious. The arrangement of the injection region 40 can avoid row hammering. For two adjacent gate electrodes 30, the corresponding two injection regions 40 are disposed oppositely, that is, close to a side of the drain region 13 between the two source regions 12.

As shown in FIG. 1, the injection region 40 is disposed in at least one of the gate oxide layer 20 and the gate electrode 30; wherein, the injection region 40 is a low work function region. The arrangement of the low work function region can reduce the threshold voltage at a side of the bottom of the channel region close to the drain region 13.

In an embodiment, both the gate oxide layer 20 and the gate electrode 30 have a center symmetric structure. When being cut along a center line, one half is close to the source region 12, and the other half is close to the drain region 13. The low work function region is located within the other half close to the drain region 13.

In an embodiment, when the low work function region is disposed within the gate electrode 30, it may be in contact with the gate oxide layer 20. Correspondingly, when the low work function region is disposed within the gate oxide layer 20, it may be in contact with at least one of the gate electrode 30 and the trench bottom wall 112.

In an embodiment, the low work function region comprises a low work function material having a work function of less than 4.55 eV. The low work function material may be directly injected into the gate oxide layer 20 and/or the gate electrode 30.

In an embodiment, the work function of the low work function material is greater than 3.8 eV. The work function of the low work function material ranges from 3.8 eV to 4.55 eV. The low work function material may be titanium/titanium nitride (Ti/TiN).

As shown in FIG. 2, the injection region 40 is disposed in the substrate 14; wherein, the injection region 40 is a counter-doped region of the substrate 14. The ions injected in the injection region 40 are opposite to the ions of the substrate 14. That is, when the substrate 14 is a P-type substrate (P-type ions), the injection region 40 is injected with N-type ions. The threshold voltage at the channel region is reduced by injecting counter-doped ions.

In an embodiment, the counter-doped region is in contact with the gate oxide layer 20, and the counter-doped region comprises at least one of phosphorus ions and arsenic ions. Wherein, the counter-doped region comprises P31.

In an embodiment, the injection region 40 is disposed on both sides of the trench bottom wall 112; wherein, the injection region 40 disposed in at least one of the gate oxide layer 20 and the gate electrode 30 is a low work function region; and the injection region 40 disposed in the substrate 14 is a counter-doped region of the substrate 14. Wherein, the low work function region comprises a low work function material having a work function range of 3.8 eV to 4.55 eV. The low work function material may be titanium/titanium nitride (Ti/TiN). The counter-doped region comprises at least one of phosphorus ions and arsenic ions.

An embodiment of the present disclosure further provides a method for manufacturing a semiconductor device, comprising: providing a substrate 14; forming a trench 11 on the substrate 14 and forming a gate oxide layer 20 in the trench 11, the trench 11 comprising trench sidewalls 111 and a trench bottom wall 112; forming a gate electrode 30 in a groove 21 of the gate oxide layer 20; forming a source region 12 and a drain region 13 on the substrate 14; and forming an injection region 40 on at least a side of the trench bottom wall 112, at least a part of the injection region 40 being closer to the drain region 13 than the source region 12 so that the threshold voltage at a portion of the channel region close to the injection region 40 is less than the threshold voltage at a portion of the channel region far from the injection region 40.

In an embodiment, after the gate oxide layer 20 and the gate electrode 30 are formed on the substrate 14, the source region 12 and the drain region 13 are formed, and then an injection region 40 is formed in at least one of the gate oxide layer 20, the gate electrode 30 and the substrate 14 to change the threshold voltage at the channel region.

In an embodiment, after the gate electrode 30 is formed in the groove 21 of the gate oxide layer 20, the method for manufacturing a semiconductor device further comprises: forming a cover layer 50 on the gate oxide layer 20. The cover layer 50 is filled in the groove 21 to shield the gate electrode 30, and the tops of the source region 12, the drain region 13, the gate oxide layer 20, and the cover layer 50 are in a same plane. The cover layer 50 is a titanium nitride (TiN) layer.

In an embodiment, the provided substrate 14 is a P-type substrate, and the source region 12 and the drain region 13 are formed in the P-type substrate by N-type ion doping. The P-type substrate is a substrate injected with P-type ions (group-III ions such as boron B or gallium Ga). The source region 12 and the drain region 13 are two lightly doped drains (LDDs) injected with N-type ions (group-V ions such as phosphorus P or arsenic As).

In an embodiment, the method of forming the injection region 40 comprises: injecting a low work function material into at least one of the gate oxide layer 20 and the gate electrode 30. Wherein, the work function of the low work function material ranges from 3.8 eV to 4.55 eV. The low work function material may be titanium/titanium nitride (Ti/TiN).

In an embodiment, the method of forming the injection region 40 comprises injecting ions opposite to ions of the substrate 14 into the substrate 14. That is, when the substrate 14 is a P-type substrate (P-type ions), the injection region 40 is injected with N-type ions. This is injection of counter ions. The counter ions comprise at least one of phosphorus ions and arsenic ions. Wherein, the arsenic ions are P31.

In an embodiment, before forming the injection region 40, the method for manufacturing a semiconductor device further comprises: forming a photoresist layer 60 on the substrate 14, the photoresist layer 60 shielding part of the drain region 13 to expose the middle of the drain region 13; and injecting according to a preset path to form the injection region 40, the preset path intersecting the middle of the drain region 13 and being inclined to the top of the drain region 13. The preset path needs to bypass the photoresist layer 60, so it needs to intersect the part of the drain region 13 that is not shielded by the photoresist layer 60.

Figure 3:
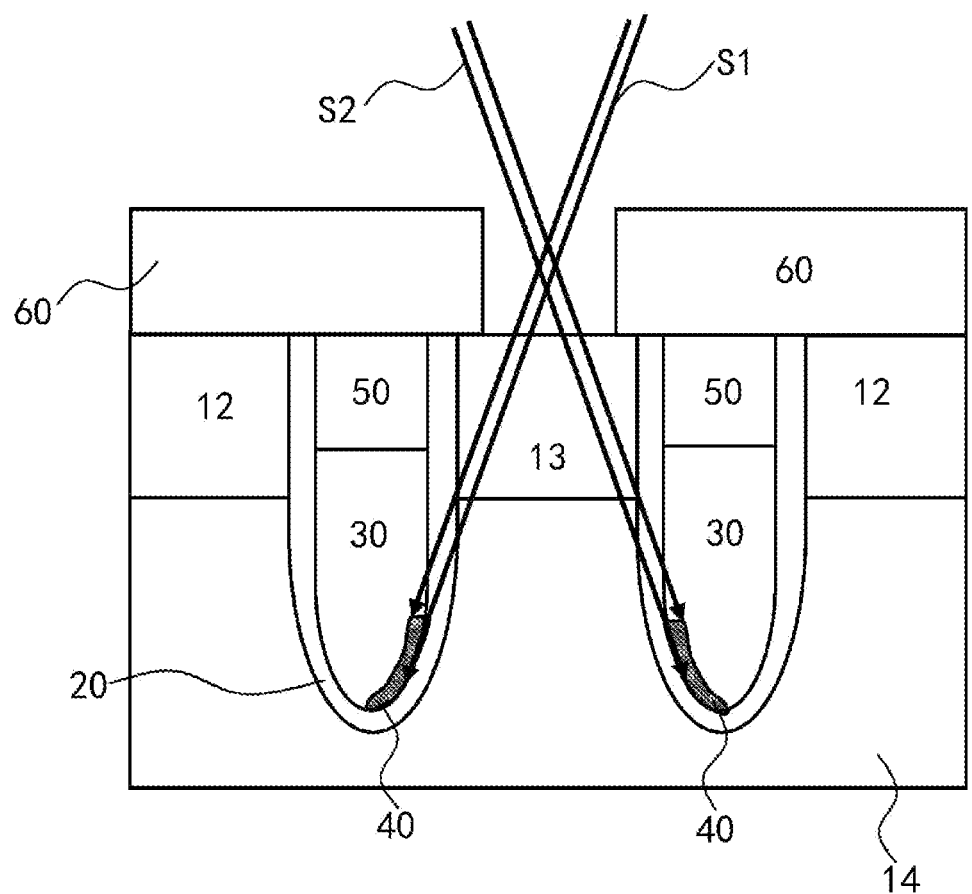
FIG. 3 is a schematic structure diagram of a manufacturing process of an injection region of a semiconductor device according to an exemplary implementation.

As shown in FIG. 3, after forming the gate oxide layer 20, the gate electrode 30, the cover layer 50, the source region 12 and the drain region 13, a photoresist layer 60 is formed. The photoresist layer 60 covers the source region 12, the gate oxide layer 20, the entire cover layer 50 and part of the drain region 13. The exposed part of the drain region 13 is used as a channel for injecting the low work function material. The low work function material may be injected at different positions in the preset paths S1 and S2. In order to ensure the amount of injection, injections are performed in multiple parallel paths.

Figure 4:
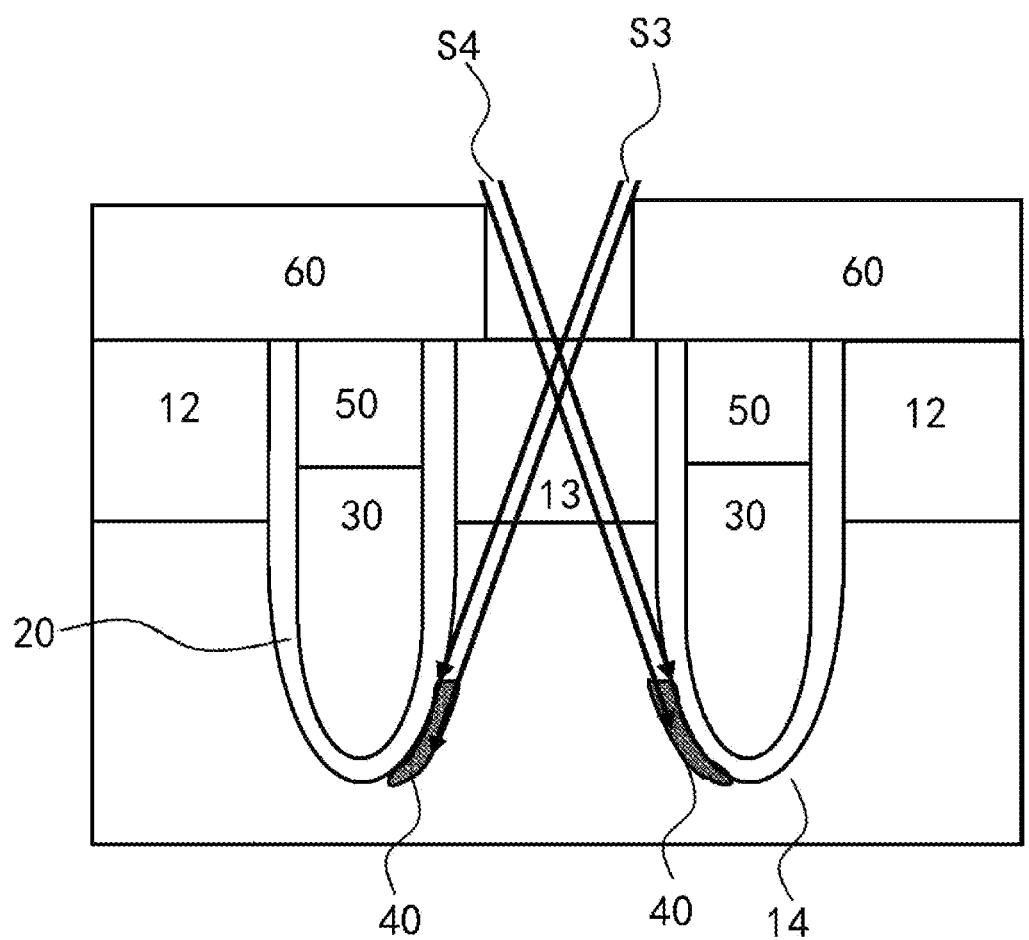
FIG. 4 is a schematic structure diagram of a manufacturing process of an injection region of a semiconductor device according to another exemplary implementation.

As shown in FIG. 4, after forming the gate oxide layer 20, the gate electrode 30, the cover layer 50, the source region 12 and the drain region 13, a photoresist layer 60 is formed. The photoresist layer 60 covers the source region 12, the gate oxide layer 20, the entire cover layer 50 and part of the drain region 13. The exposed part of the drain region 13 is used as a channel for injecting counter ions. The counter ions may be injected at different positions in the preset paths S3 and S4. In order to ensure the amount of injection, injections are performed in multiple parallel paths.

Those skilled in the art will readily think of other embodiments of the present disclosure by considering the specification and practicing the invention disclosed herein. The present disclosure is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the exemplary implementations are just exemplary, and the true scope and spirit of the present disclosure are defined by the appended claims.

It should be understood that the present disclosure is not limited to the precise structures that have been described above and shown in the drawings, and various modifications and changes may be made without departing from its scope. The scope of the present disclosure is defined only by the appended claims.

What is claimed is:

1. A MOSFET device, comprising:
    a substrate, the substrate comprising a trench, a source region, a drain region and a channel region, the trench comprising trench sidewalls and a trench bottom wall;
    a gate oxide layer, disposed in the trench, the gate oxide layer comprising a groove;
    a gate electrode disposed in the groove; and
    an injection region located on at least a side of the trench bottom wall, at least a part of the injection region being closer to the drain region than the source region so that a threshold voltage at a portion of the channel region close to the injection region is less than a threshold voltage at a portion of the channel region far from the injection region;
    wherein the injection region is disposed in at least one of the gate oxide layer and the gate electrode;
    wherein the injection region is a low work function region.

2. The MOSFET device according to claim 1, wherein the trench bottom wall has a bottom end, the injection region extends along an extension direction of the trench bottom wall, and the injection region is located on a side of the bottom end close to the drain region.

3. The MOSFET device according to claim 1, wherein the gate electrode is disposed in the groove, and the semiconductor device further comprises:
    a cover layer disposed on the gate electrode and located in the groove.

4. The MOSFET device according to claim 1, wherein the substrate is a P-type substrate, and the source region and the drain region are both N-type ion doped regions.

5. The MOSFET device according to claim 1, wherein there are multiple gate electrodes and two adjacent gate electrodes of the multiple gate electrodes share one drain region.

6. The MOSFET device according to claim 1, wherein the low work function region comprises a low work function material having a work function of less than 4.55 eV.

7. The MOSFET device of claim 6, wherein the work function of the low work function material is greater than 3.8 eV.

8. A method for manufacturing a MOSFET device, comprising:
    providing a substrate;
    forming a trench on the substrate and forming a gate oxide layer in the trench, the trench comprising trench sidewalls and a trench bottom wall;
    forming a gate electrode in a groove of the gate oxide layer;
    forming a source region and a drain region on the substrate; and
    forming an injection region on at least a side of the trench bottom wall, at least a part of the injection region being closer to the drain region than the source region so that a threshold voltage at a portion of the channel region close to the injection region is less than a threshold voltage at a portion of the channel region far from the injection region; and said forming the injection region comprises:
    injecting a low work function material into at least one of the gate oxide layer and the gate electrode.

9. The method for manufacturing a semiconductor device according to claim 8, said forming the injection region comprises:
    injecting a low work function material into at least one of the gate oxide layer and the gate electrode.

10. The method for manufacturing a semiconductor device according to claim 8, said forming the injection region comprises:
    injecting ions opposite to ions of the substrate into the substrate.

11. The method for manufacturing a MOSFET device according to claim 8, before the forming the injection region, further comprising:
    forming a photoresist layer on the substrate, the photoresist layer shielding part of the drain region to expose a middle of the drain region; and
    injecting according to a preset path to form the injection region, the preset path intersecting the middle of the drain region and being inclined to a top of the drain region.

12. The method for manufacturing a semiconductor device according to claim 10, before the forming the injection region, further comprising:
    forming a photoresist layer on the substrate, the photoresist layer shielding part of the drain region to expose a middle of the drain region; and
    injecting according to a preset path to form the injection region, the preset path intersecting the middle of the drain region and being inclined to a top of the drain region.

* * * * *